(12) United States Patent
Gmundner et al.

(10) Patent No.: US 11,574,849 B2
(45) Date of Patent: Feb. 7, 2023

(54) PACKAGE WITH EMBEDDED ELECTRONIC COMPONENT BEING ENCAPSULATED IN A PRESSURELESS WAY

(71) Applicant: AT&S Austria Technologie & Systemtechnik Aktiengesellschaft, Leoben (AT)

(72) Inventors: Gernot Gmundner, Parschlug (AT); Gernot Schulz, Graz (AT)

(73) Assignee: AT&S Austria Technologie & Systemtechnik AG, Leoben (AT)

( * ) Notice: Subject to any disclaimer, the term of this patent is extended or adjusted under 35 U.S.C. 154(b) by 45 days.

(21) Appl. No.: 16/591,056

(22) Filed: Oct. 2, 2019

(65) Prior Publication Data
US 2020/0111717 A1   Apr. 9, 2020

(30) Foreign Application Priority Data
Oct. 5, 2018 (EP) .................................... 18198848

(51) Int. Cl.
*H01L 23/31* (2006.01)
*H01L 21/56* (2006.01)

(52) U.S. Cl.
CPC ........ *H01L 23/3121* (2013.01); *H01L 21/561* (2013.01); *H01L 23/3135* (2013.01)

(58) Field of Classification Search
CPC ............... H01L 23/3121; H01L 23/552; H01L 23/3135; H01L 21/56; H01L 21/561;
(Continued)

(56) References Cited

U.S. PATENT DOCUMENTS 5,313,365 A    5/1994  Pennisi et al.
5,863,970 A *  1/1999  Ghoshal .................. C08G 59/38
                                                       525/484
(Continued)

FOREIGN PATENT DOCUMENTS

CN    101334854 A    12/2008
CN    103635028 A    3/2014
(Continued)

OTHER PUBLICATIONS

Extended European Search Report in Application 18198848.6, dated May 19, 2019, pp. 1-17, European Patent Office, Munich, Germany.

*Primary Examiner* — Vongsavanh Sengdara
(74) *Attorney, Agent, or Firm* — Robert A. Blaha; Smith Tempel Blaha LLC

(57) ABSTRACT

A method of manufacturing an electronic package is disclosed. The described method includes (a) placing an electronic component on at least one layer structure; (b) encapsulating the electronic component by an encapsulant in a pressureless way; and (c) forming at least one further layer structure at the layer structure to thereby form a stack beneath the encapsulated electronic component. A further described electronic package includes (a) a stack comprising at least one layer structure and at least one further layer structure; (b) an electronic component being placed on the stack; and (c) an encapsulant encapsulating the electronic component, wherein the encapsulant has been formed in a pressureless way. Further described is an electronic device comprising such an electronic package.

15 Claims, 2 Drawing Sheets

(58) Field of Classification Search
CPC ... H01L 24/19; H01L 24/27; H01L 2924/351;
H01L 2924/1436; H01L 2924/19041;
H01L 2924/15313; H01L 2924/1431;
H01L 2924/181; H01L 2924/1461
See application file for complete search history.

(56) References Cited

U.S. PATENT DOCUMENTS

| | | | |
|---|---|---|---|
| 6,737,755 B1* | 5/2004 | McLellan | H01L 23/24 257/E23.09 |
| 2005/0093172 A1 | 5/2005 | Tsukahara et al. | |
| 2005/0184405 A1 | 8/2005 | Bai et al. | |
| 2006/0180938 A1* | 8/2006 | Kurihara | H01L 23/49822 257/E23.079 |
| 2012/0286405 A1 | 11/2012 | Toyota | |
| 2014/0027929 A1* | 1/2014 | Lin | H01L 24/96 257/774 |
| 2015/0287894 A1* | 10/2015 | Toita | H01L 33/54 257/98 |
| 2016/0155713 A1* | 6/2016 | Kim | H01L 23/552 257/659 |
| 2017/0250171 A1* | 8/2017 | Yu | H01L 24/19 |
| 2018/0204741 A1* | 7/2018 | Chew | H01L 24/24 |
| 2019/0006339 A1* | 1/2019 | Lau | H01L 24/05 |
| 2020/0203187 A1* | 6/2020 | Chew | H01L 21/6835 |

FOREIGN PATENT DOCUMENTS

| | | |
|---|---|---|
| KR | 20100107543 A | 10/2010 |
| WO | 2016094799 A1 | 6/2016 |

* cited by examiner

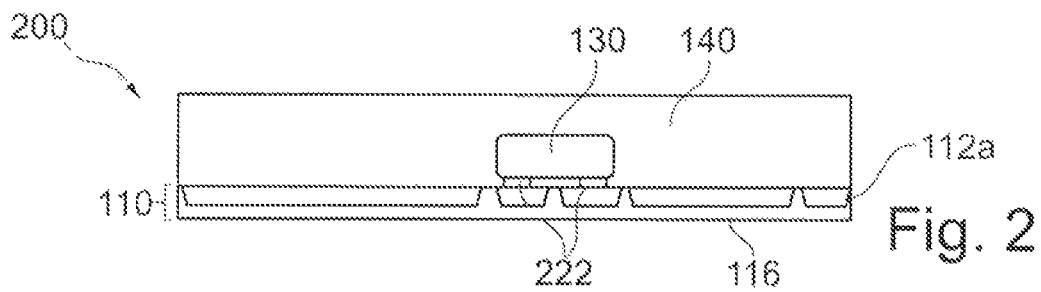
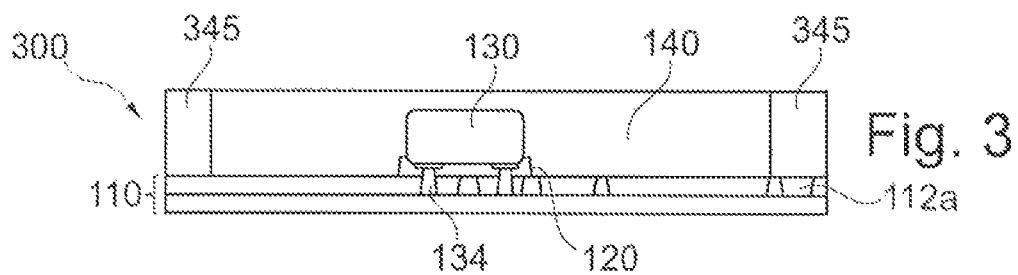
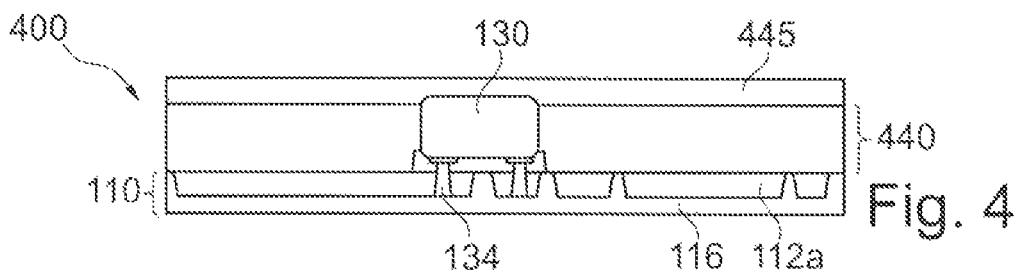
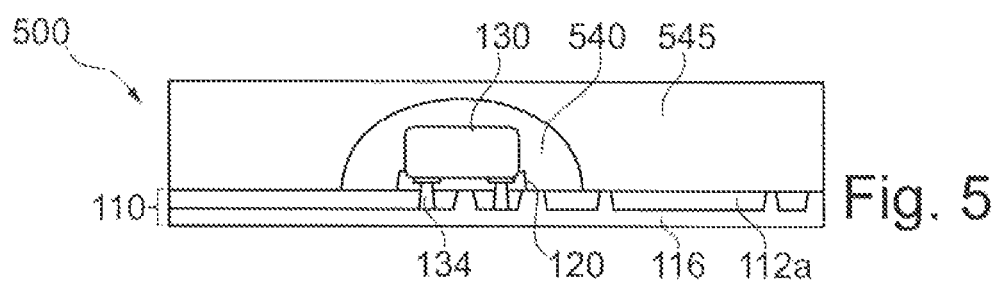
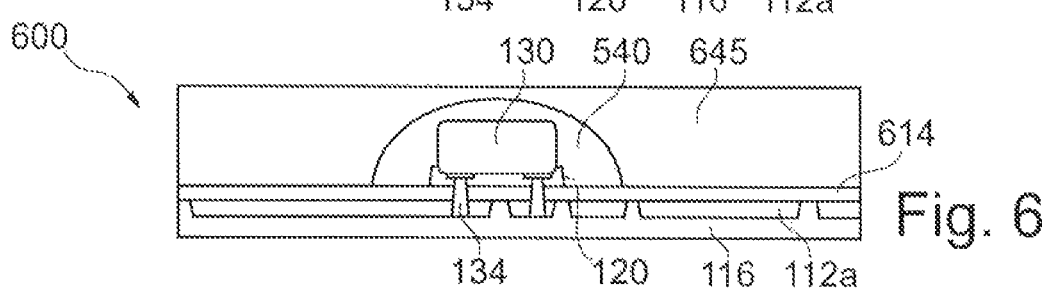
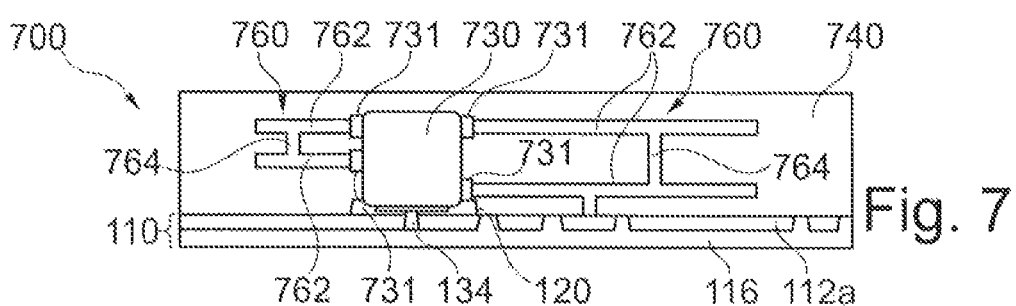

PACKAGE WITH EMBEDDED ELECTRONIC COMPONENT BEING ENCAPSULATED IN A PRESSURELESS WAY

TECHNICAL FIELD

Embodiments of the present invention generally relate to the technical field of electronic packages, wherein an electronic component is embedded in an encapsulant material.

TECHNOLOGICAL BACKGROUND

Integrated circuit components are typically put into packages in order to allow for an easy handling and reliable assembly of electronic circuits e.g. onto a component carrier such as a printed circuit board (PCB). A package for or of an integrated circuit further provides protection for the packaged electronic component against e.g. mechanical and/or chemical impacts.

A placement of packaged electronic components on a component carrier is typically carried out by surface mounting by means of an automatic placement machine. For realizing a high integration density of electronic assemblies it is known to use multilayer PCBs. A multilayer PCB comprises appropriately structured or patterned (horizontal) intermediate electrically conductive layer structures, which are selectively interconnected with each other by means of (vertical) interconnects such as metallized vias. Thereby, the "third dimension" of the component carrier is utilized for realizing a wiring by means of appropriately structured and interconnected conductor traces.

For further increasing the integration density of electronic assembles being mounted at a component carrier it is known to embed electronic components, e.g. RFID tags, within the component carrier. Embedding is a process which must be carried out with care for instance to avoid or reduce mechanical stress acting on the electronic component and to ensure a sufficient reliability of electric connections of the electronic component even under thermal stress.

SUMMARY

There may be a need for embedding an electronic component within a component carrier for manufacturing an electronic package in an easy, reliable, and efficient manner.

This need may be met by the subject matter according to the independent claims. Advantageous embodiments of the present invention are described by the dependent claims.

According to a first aspect of the invention there is provided a method of manufacturing an electronic package. The provided method comprises (a) placing an electronic component on at least one layer structure; (b) encapsulating the electronic component by an encapsulant (material) in a pressureless way; and (c) forming at least one further layer structure at the layer structure to thereby form a stack beneath the encapsulated electronic component.

According to a further embodiment of the invention (the step of) encapsulating the electronic component comprises a deposition of encapsulation material by means of at least one of the following procedures: (a) printing, in particular screen printing; (b) coating; (c) additive manufacturing, in particular three-dimensional printing; (d) dispensing, in particular ink jet dispensing. This may provide the advantage that depending on the chosen material property for the encapsulant an appropriate procedure for applying and/or depositing the encapsulant (material) prior to forming the encapsulant (structure).

According to a further aspect of the invention there is provided an electronic package comprising (a) a stack comprising at least one layer structure and at least one further layer structure; (b) an electronic component being placed on the stack; and (c) an encapsulant encapsulating the electronic component, wherein the encapsulant has been formed in a pressureless way.

OVERVIEW OF EMBODIMENTS

Before describing in detail the invention and embodiments of the invention some technical terms used in this document are elucidated.

In the context of this document the term "electronic component" may be any component which has an electronic functionality and/or which assists another component to improve its electronic functionality. A component can be selected from a group consisting of an electrically non-conductive inlay, an electrically conductive inlay (such as a metal inlay, preferably comprising copper or aluminum), a heat transfer unit (for example a heat pipe), an electronic component, or combinations thereof. For example, the component can be an active electronic component, a passive electronic component, an electronic chip, a storage device (for instance a DRAM or another data memory), a filter, an integrated circuit, a signal processing component, a power management component, an optoelectronic interface element, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element or a ferrimagnetic element, for instance a ferrite core) or may be a paramagnetic element. However, the component may also be a further component carrier, for example in a board-in-board configuration. The component may be surface mounted on the component carrier and/or may be embedded in an interior thereof. Moreover, also other components, in particular those which generate and emit electromagnetic radiation and/or are sensitive with regard to electromagnetic radiation propagating from an environment, may be used as component.

The term "encapsulant" used in this document may refer to any (dielectric) embedding material, which can be processed in a pressureless manner. In embodiments of the invention polyimide, silicone or other plastic materials are used. The embedding material may have, at least before or during the encapsulation step, a paste-like shape or a viscous liquid condition. The embedding material may be or may comprise for example epoxy resin or acrylates. The embedding material may also be a material such as e.g. a ceramic or a metal.

The term "stack" may refer to a sequence of layers respectively layer structures in a vertical z-direction, wherein the main surfaces of the layers respectively the layer structures extend in a horizontal xy-direction. The stack may comprise or consist of a (an alternating) sequence of electrically conductive layer structures and electrically insulating or dielectric layer structures.

An "electrically conductive layer (structure)" may comprise at least one of the group consisting of copper, aluminum, nickel, silver, gold, palladium, and tungsten. Although copper is usually preferred, other materials or coated versions thereof are possible as well, in particular coated with supra-conductive material such as graphene.

An "electrically insulating layer (structure)" may comprise at least one of the group consisting of resin (such as reinforced or non-reinforced resins, for instance epoxy resin or Bismaleimide-Triazine resin), cyanate ester, polyphenylene derivate, glass (in particular glass fibers, multi-layer glass, glass-like materials), prepreg material (such as FR-4 or FR-5), polyimide, polyamide, liquid crystal polymer (LCP), epoxy-based Build-Up Film, polytetrafluoroethylene (Teflon®), a ceramic, and a metal oxide. Reinforcing materials such as webs, fibers or spheres, for example made of glass (multilayer glass) may be used as well. Teflon® is a registered trademark of the Chemours Company, LLC of Wilmington, Del., U.S.A. Although prepreg particularly FR4 are usually preferred for rigid PCBs, other materials in particular epoxy-based Build-Up Film for substrates may be used as well. For high frequency applications, high-frequency materials such as polytetrafluoroethylene, liquid crystal polymer and/or cyanate ester resins, low temperature cofired ceramics (LTCC) or other low, very low or ultra-low DK-materials may be implemented in the component carrier as electrically insulating layer structure.

The term "PCB material" may refer to any material which is known to be used in the manufacturing of PCBs. Hence, "PCB materials" may be either (i) electrically conductive materials or (ii) electrically insulating or dielectric materials. Examples for these materials are given above in the context of the elucidation of the terms "electrically conductive layer (structure)" and "electrically insulating layer (structure)".

The term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above-mentioned types of component carriers. In an embodiment, the component carrier comprises a stack of at least one electrically insulating layer (structure) and at least one electrically conductive layer (structure). For example, the component carrier may be a laminate of the mentioned electrically insulating layer structure(s) and electrically conductive layer structure(s), in particular formed by applying mechanical pressure and/or thermal energy. The mentioned stack may provide a plate-shaped component carrier capable of providing a large mounting surface for further components and being nevertheless very thin and compact.

In some embodiments the "component carrier" may be realized by means of a simple copper foil or by means of a copper foil with a dielectric layer being applied or formed at one surface of the copper foil. Such a copper/dielectric system may be a semifinished product, which is often denominated Resin Coated Copper Foil (RCF).

The term "layer structure" may particularly denote a continuous layer, a patterned layer or a plurality of non-consecutive islands within a common plane.

In an embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

In an embodiment, the component carrier is configured as one of the group consisting of a printed circuit board, and a substrate (in particular an IC substrate).

In the context of the present application, the term "printed circuit board" (PCB) may particularly denote a plate-shaped component carrier which is formed by laminating several electrically conductive layer structures with several electrically insulating layer structures, for instance by applying pressure, if desired accompanied and/or by the supply of thermal energy. As preferred materials for PCB technology, the electrically conductive layer structures are made of copper, whereas the electrically insulating layer structures may comprise resin and/or glass fibers, so-called prepreg or such as FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

The described method is based on the idea that an electronic package can be realized with an additive manufacturing process, which starts with the at least one layer structure as a structure onto or at which all other elements, i.e. the electronic component, the encapsulant, and the at least one further layer structure are formed respectively placed. Of course, also further elements, which might by additively placed or formed at the described electronic package may be used for realizing a more complex package or build up structure.

The materials of the at least one layer structure and/or the at least one further layer structure used for packaging the electronic component may be so-called PCB materials as specified above. This means that in this case the described electronic package can be seen as a component carrier such as a printed circuit board, which comprises an embedded electronic component.

In this document the term "pressureless" may mean in particular that the encapsulant is formed on the layer structure and at the placed component without applying an external pressure, which in other applications is applied by means of an appropriate pressure exerting element such as e.g. a mold. Of course, when applying or adding the encapsulant there might be a comparatively short pressure which is based on the mass momentum of the encapsulant material when impacting on the at least one layer structure and/or at the electronic component. Specifically, the term "pressureless" means that the encapsulant is not formed by means of a lamination process, which is widely used when manufacturing component carriers such as in particular (multilayer) printed circuit boards (PCBs).

It is pointed out that other steps of the described method may be carried out under pressure and/or may be supported by (external) pressure. Specifically, the step of forming the at least one further layer structure may be realized by a lamination process, which may be supported by pressure. This pressure may by applied by sandwiching the entire electronic package between two pressurizing elements, e.g.

two plates, such that also the already formed encapsulant structure is put under pressure. However, since the formation of the encapsulant structure has already been completed at least partially, the pressure applied on the entire electronic package has no impact on the encapsulation procedure.

The described stack formed beneath or below the encapsulated component comprises the at least one layer structure and the at least one further layer structure. The number of layers structures of the stack depends of course on the number of layer structures and the (further) number of further layer structures. Preferably, the stack comprises a sequence of electrically conductive layer structures and electrically non-conductive or dielectric layer structures.

According to an embodiment of the invention (the step of) encapsulating the electronic component is accomplished at a temperature being less than 200° C., in particular less than 150° C. and further in particular less than 130° C. This may provide the advantage that the encapsulation process will not require a (significant) increase of the temperature which might harm the electronic component. Hence, also very "thermo-critical" electronic components can be packaged in an easy and reliable manner.

A limited environmental temperature as described above may be realized by encapsulating the electronic component (a) in the absence of additional thermal energy or (b) in the presence of only a small amount of additional thermal energy as compared to known encapsulation processes which are carried out at higher temperatures. The encapsulant may be a UV curable material and the encapsulation process may comprise a UV curing which can be carried at comparatively small temperatures. It is pointed out that other steps of the described method may be carried out or may be supported by thermal energy. Specifically, the step of forming the at least one further layer structure may be realized by a lamination process, which is supported by thermal energy and optionally also by applying pressure.

According to a further embodiment of the invention (the step of) placing the electronic component comprises (a) applying an adhesive material onto (or at the most upper one of) the at least one layer structure; and (b) placing the electronic component on the adhesive material.

The adhesive material may be an adhesive layer structure which, with regard to its laminar or quasi two-dimensional extension, may be restricted to a region on (the most upper one of) the at least one layer structure, which region is assigned to the electronic component. This may mean that the adhesive material is spatially restricted to the size of surface of the electronic component, which surface is oriented parallel to the main planes of the at least one (further) layer structure. Alternatively, the region within which the adhesive material is applied may be slightly larger than this surface in order to guarantee a safe placement of the electronic component.

According to a further embodiment of the invention (the step of) placing the electronic component comprises bonding the electronic component to (the most upper one of) the at least one layer structure. This may provide the advantage that within one and the same placement process the electronic component may not only be mechanically secured to the at least one layer structure but also an electrical connection may be formed between at least one terminal of the electronic component and an appropriately structured electrically conductive (metal) layer of the at least one layer structure.

Also, for bonding the electronic component well proven and tested bonding procedures such as for instance thermo pressure bonding and ultrasonic bonding may be employed.

According to a further embodiment of the invention the electronic component is encapsulated together with at least one further electronic component which, after a singularizing process, forms a part of a further electronic package.

Encapsulating, within one encapsulating step, at least two or preferably a plurality of electronic components may provide the advantage that a plurality of electronic packages of the described type can be manufactured in an effective manner.

Descriptively speaking, according to the embodiment described here the described electronic package is manufactured on a so-called panel level basis, wherein a plurality of electronic packages are formed on or within a large panel PCB. After finalizing the formation of the individual electronic packages within the entire PCB panel one or more singularizing procedures are carried out in order to end up with electronic arrangements, which comprise an appropriate number of embedded electronic components.

Also, the described electronic package is based on the idea that due to the capability of the encapsulant to be processed in a pressureless way the principles of additive manufacturing can be exploited in order to realize the electronic package in an easy and effective manner.

It is pointed out that experts in the field are able to determine, based e.g. on a structural study of the encapsulant (material), that the encapsulant (structure) has been formed without additional or external pressure, i.e. in a pressureless way. In particular, a skilled person is able to determine that the encapsulant structure has not been realized or formed by means of a lamination process which involves at least temporarily the application of pressure. Specifically, if a material (system) is cured under pressure the surface is flat as the plastics is forced into a symmetric form (e.g. rectangular). If no pressure is applied during curing a shrink of the plastics results giving the surface a non-flat or non-smooth shape (e.g. convex or concave).

According to a further embodiment of the invention the at least one layer structure consists of or comprises at least one electrically conductive layer structure. Alternatively or in combination, the at least one further layer structure consists of or comprises at least one electrically insulating layer structure. This may provide the advantage that the stack can be realized as a multilayer stack comprising a sequence of (i) electrically conductive layer structure(s) and (ii) electrically insulating layer structure(s). This may allow for forming, by means of usual PCB manufacturing procedures and with usual and well proven PCB materials, a three-dimensional wiring structure for electrically contacting the encapsulated electronic component and/or for providing further electrical connections to and/or from other electronic components. Appropriate manufacturing procedures may include for example (i) a patterning of at least one electrically conductive layer structure, for instance a metallic (Cu) layer, (ii) forming metallized vias in order to electrically interconnect different electrically conductive layer structures, which are (vertically) separated by at least one electrically insulating layer structure, and (iii) laminating different layer structures (e.g. electrically insulating prepreg layer structures and (patterned) metallic layer structures) in order to form a mechanical stable layer stack.

According to a further embodiment of the invention the encapsulant is not suitable to be applied under external pressure. Specifically, the encapsulant (material) may be a material which, when being put under pressure, would change its physical and/or chemical properties such that no appropriate encapsulant (structure) would be formed. This may hold true at least when the encapsulant (material) is in a state where the formation of the encapsulant (structure) has not yet been completed. Specifically, the non-suitability of the encapsulant (material) regarding external pressure may hold true for an uncured stated of the encapsulant.

According to a further embodiment of the invention the stack represents a first (multilayer) portion of a component carrier, in particular a printed circuit board, and the encapsulant represents a second portion of the component carrier. This may provide the advantage that all layer structures of the described electronic package (e.g. the entire electronic package excluding the encapsulant and the electronic component, which may be fabricated with semiconductor processes) may be produced with PCB materials and/or with PCB manufacturing procedures. Hence, well proven and tested materials and procedures can be employed in order to manufacture the described electronic package in a reliable and efficient manner.

It is pointed out that in this embodiment the electronic component may be seen as to represent an embedded electronic component. Accordingly, the described electronic package may be seen as to represent a non-semiconductor component carrier and in particular a PCB within which the electronic component is embedded or accommodated.

According to a further embodiment of the invention the electronic package is a hybrid structure comprising the stack as a printed circuit board structure and the encapsulant as a non-printed circuit board structure. This may allow for realizing the described electronic package in a particular efficient manner. Specifically, a non-PCB manufacturing process step, i.e. the pressureless formation of the encapsulant (structure), which allows for both a smooth and an efficient encapsulating/embedding of the electronic component, may be integrated or combined with known and well approved PCB manufacturing procedures. In other words, for realizing the described printed circuit board structure for all process steps the best suited manufacturing (sub)procedure can be employed.

According to a further embodiment of the invention the electronic package further comprises a further encapsulant surrounding the encapsulant, the further encapsulant being different from the encapsulant. Thereby, the further encapsulant may comprise an electrically conductive material such as electrically conductive particles.

The further encapsulant may be made from or may comprise a different material as compared to the material of the encapsulant. A further material of the further encapsulant may be a material, which is known from PCB manufacturing. Typical (dielectric) embedding materials as mentioned above may be used for realizing the further encapsulant.

In some embodiments, the further encapsulant is processed, by contrast to the encapsulant material, under (external) pressure. Thereby, lamination procedures known from PCB technology may be employed.

The encapsulant may encapsulate the electronic component "locally", for instance in a dome like or cupola like manner. Such configuration may be in particular suitable when applying the encapsulant (material) in a pressureless manner by means of a dispensing procedure.

Adding an electrically conductive material may be in particular suitable in case of electronic components and/or for an application of the described electronic device, which application requires an electromagnetic shielding. Depending on the frequency of the electromagnetic radiation to be shielded a proper electrically conductive material and/or a proper size of electrically conductive particles may be selected. The electrically conductive particles may be in particular metallic particles.

According to a further embodiment of the invention the encapsulant encapsulating the electronic component and/or the further encapsulant surrounding the encapsulant have a planar surface, wherein the planar surface is opposite to the stack. This may provide the advantage that an upper surface of the described electronic package is planar. This may facilitate a further handling and/or a further processing of the described electronic package.

According to a further embodiment of the invention the electronic package comprises at least one of the following features: (a) the electronic package further comprises a wiring structure being embedded within the encapsulant and/or within the further encapsulant, the wiring structure being configured for electrically connecting the electronic component; (b) the electronic package further comprises at least one protection layer structure which in particular is formed beneath the stack or which in particular forms a part of the stack.

The wiring structure may be realized by means of techniques which are known from manufacturing (multilayer) PCBs. Thereby, an electrically conductive structure may be built up which comprises at least one patterned (horizontal) layer structure of an electrically conductive material and/or at least one vertical interconnect which is connecting different patterned (horizontal) layer structures and which may be realized in particular by means of a metallized via.

The protection layer structure may also be made from or comprise a known material, which is presently used in PCB fabrication or processing processes. Suitable materials for the described protection layer structure may be for instance plastic materials which can be applied in a pressureless manner. Generally, any above-mentioned material being suitable for realizing the electrically insulating layer (structure) can be used. In preferred embodiments the protection layer structure may be realized by means of a solder mask.

According to a further aspect of the invention there is provided an electronic device comprising (a) a support structure, in particular a printed circuit board; and (b) an electronic package as described above, wherein the electronic package is mounted at the support structure. The described electronic device is based on the idea that the above described electronic package does not only provide for a smooth and efficient embedding of the electronic component but is also suitable for being mounted to a superordinate support structure, in particular a component carrier and further in particular and preferably to a printed circuit board (PCB). If already the at least one layer structure and/or the at least one further layer structure of the electronic package is made from PCB materials such that the electronic package represents a subordinated PCB the described electronic device is a build-up structure comprising (at least) two stacked PCBs.

It is pointed out that the expression "mounted on the support structure" may not only mean that the electronic package is attached, if applicable with appropriate electric connections to and/or from the encapsulated electronic component, at a surface of the support structure. In particular, if the support structure is a multilayer PCB the electronic package may also be embedded within the multilayer PCB. In this case, if also the electronic package is or comprises a PCB, the electronic device can be understood as to represent a PCB in PCB arrangement.

It has to be noted that embodiments of the invention have been described with reference to different subject matters. In particular, some embodiments have been described with reference to method type claims whereas other embodiments have been described with reference to apparatus type claims.

However, a person skilled in the art will gather from the above and the following description that, unless otherwise notified, in addition to any combination of features belonging to one type of subject matter also any combination between features relating to different subject matters, in particular between features of the method type claims and features of the apparatus type claims is considered as to be disclosed with this document.

The aspects defined above and further aspects of the present invention are apparent from the examples of embodiment to be described hereinafter and are explained with reference to the examples of embodiment. The invention will be described in more detail hereinafter with reference to examples of embodiment but to which the invention is not limited.

BRIEF DESCRIPTION OF THE DRAWINGS

FIG. 2 shows an electronic package with an encapsulated electronic component bonded to an electrically conductive layer structure of a stack of PCB material layers.

FIG. 3 shows an electronic package with a barrier structure, which laterally confines the encapsulant material.

FIG. 4 shows an electronic package with an electronic component being encapsulated by means of two different encapsulants.

FIG. 5 shows an electronic package with an electronic component being encapsulated by means of a dome like first encapsulant and a planarizing second encapsulant.

FIG. 6 shows an electronic package with two encapsulants wherein one encapsulant comprises electrically conductive particles.

FIG. 7 shows an electronic package comprising an electric wiring structure formed within an encapsulation material encapsulating an electronic component.

DETAILED DESCRIPTION OF ILLUSTRATED EMBODIMENTS

Figure 1A:
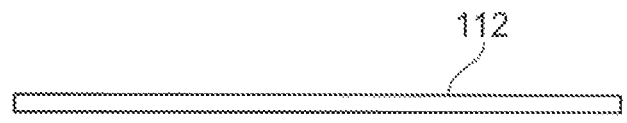
FIGS. 1A. 1B, 1C, 1D, 1E to 1F illustrate a process for manufacturing an electronic package by means of encapsulating an electronic component in a pressureless way.

The illustrations in the drawings are schematically presented. It is noted that in different figures, similar or identical elements or features are provided with the same reference signs or with reference signs, which are different from the corresponding reference signs only within the first digit. In order to avoid unnecessary repetitions elements or features, which have already been elucidated with respect to a previously described embodiment, are not elucidated again at a later position of the description.

Further, spatially relative terms, such as "front" and "back", "above" and "below", "left" and "right", et cetera are used to describe an element's relationship to another element or elements as illustrated in the Figures. Thus, the spatially relative terms may apply to orientations in use which differ from the orientation depicted in the Figures. Obviously, all such spatially relative terms refer to the orientation shown in the Figures only for ease of description and are not necessarily limiting as an apparatus according to an embodiment of the invention can assume orientations different than those illustrated in the Figures when in use.

An important technical aspect of the embodiments described below is that an electronic component being placed on a metallic foil is embedded with an additive process in a pressureless manner. Electric interconnects and a patterning (of the metallic foil) is done with conventional PCB technologies. The crucial advantage of this concept is that no high pressure and no high temperatures acts on the electronic components. Further, no laser cuts for forming cavities are needed. Due to these advantages thinned and sensible electronic components can be embedded and used for initial function testing up to final products.

FIGS. 1A to 1F illustrate a process for manufacturing an electronic package 100 in accordance with an embodiment of the invention.

As can be seen from FIG. 1A, the manufacturing process starts with providing an electrically conductive layer structure 112 as a (mechanical) support structure. According to the embodiment described here the electrically conductive layer structure 112 is a metal foil, preferably a metal foil made from copper.

Figure 1B:
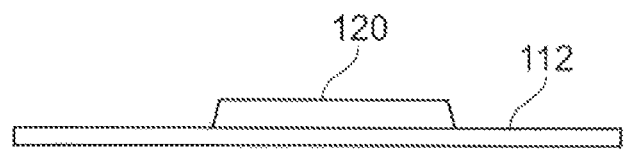

In a next step shown in FIG. 1B, an adhesive material 120 is applied to the upper surface of the electrically conductive layer structure 112. Thereby, the application of the adhesive material 120, which can be carried out for instance by means of an appropriate dispensing procedure, is spatially restricted to a selected (sub)region of the upper surface. This (sub)region corresponds to the region where in a next step an electronic component is to be placed or mounted.

The adhesive material 120 may be based on an epoxy or acrylic chemical system or on any other chemical system having similar properties. In some embodiments the adhesive material 120 is an electrically conductive glue, which may have an anisotropic conductivity. Further, the adhesive material 120 may be a thermally conductive glue.

The adhesive material 120 may also be applied by (a) printing, in particular screen printing or ink jet printing; (b) coating; and/or (c) additive manufacturing, in particular three-dimensional printing.

Figure 1C:
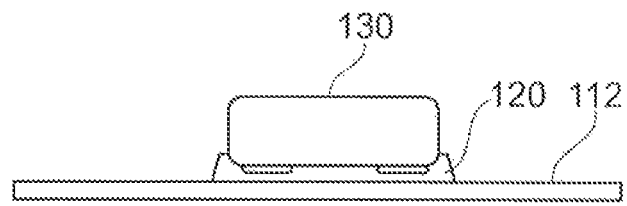

In a next step shown in FIG. 1C, the electronic component 130 is placed or mounted onto the adhesive material 120. Depending on the chemical system used for the adhesive material 120, a non-depicted curing step may be needed to be carried out. The curing may be realized by means of thermal energy, UV radiation etc.

Figure 1D:
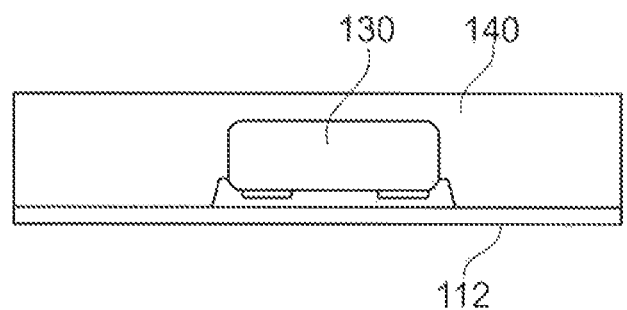

In a next step shown in FIG. 1D, the electronic component 130 is coated respectively encapsulated with an encapsulant/embedding material 140. The formation of the encapsulant 140 can be realized by screen printing, coating, 3D printing, inkjet printing, dispensing, or any other suitable procedure which allows for forming the encapsulant 140 in a pressureless way, i.e. without any external pressure. Depending on the procedure(s) used for forming the encapsulant 140 the formation of the encapsulant 140 can be supported by appropriate stencils or frames which are used for realizing a proper three-dimensional shape and/or size for the encapsulant 140.

Suitable materials for the encapsulant 140 may be for instance polyimide, silicone, or any other plastic material in a paste or liquid condition, which is suitable to be processed in a pressureless manner.

Figure 1E:
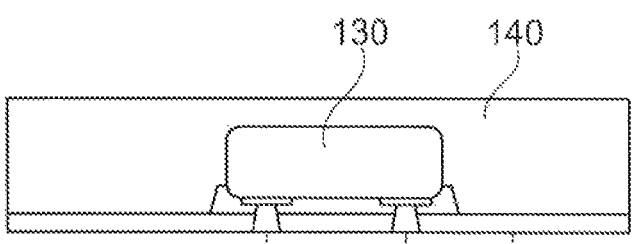

In a next step shown in FIG. 1E, which follows the previous "housing step", electric connections between the electrically conductive layer structure 112 and (the terminals of) the embedded/encapsulated electronic component 130 are formed. This can be realized by means of a suitable laser process, by means of a mechanical drilling process, by means of acid processing or whatever is needed for creating a via channel for the electric connections. After an appropriate via channel plating procedure, the electrically conductive via connections 134 are formed for electrically connecting the embedded/encapsulated electronic component 130 with non-depicted external circuitry.

Figure 1F:
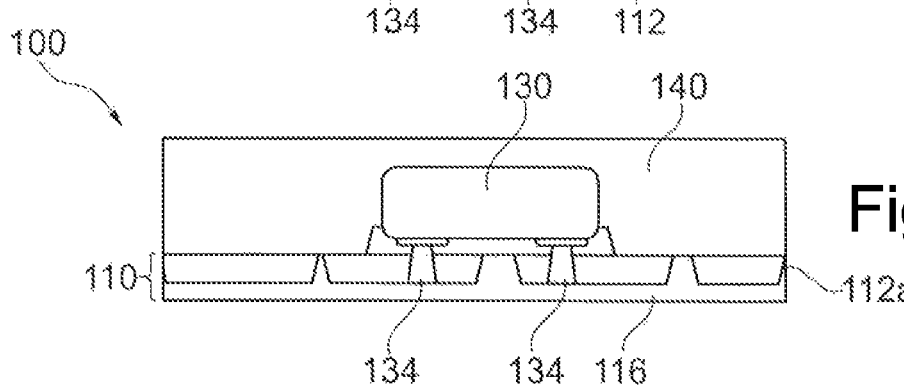

In a next step, as can be taken from FIG. 1F, a patterning or structuring of the electrically conductive layer structure 112 is carried out. The resulting patterned electrically conductive layer structure/metal foil, which is denominated with reference numeral 112a, can be used for electrically connecting the embedded electronic component 130 with a further non-depicted component carrier, onto which the electronic package 100 is mounted for instance by means of a surface mounting process.

In a next step, as can also be taken from FIG. 1F, a surface protection layer structure 116 is formed as a further layer structure beneath the electrically conductive layer structure 112. Thereby, the electrically conductive layer structure and the further layer structure 116 form a stack 110 (of a component carrier) carrying the (embedded or encapsulated) electronic component 130.

The surface protection layer structure 116 may be used in particular for protecting the metal foil 112 respectively the structured metal foil 112a against oxidation. The protection layer 116 may be a metal layer, which can be processed by soldering, and/or a plastic layer. Suitable materials for the protection layer 116 are for instance electroless nickel immersion gold (ENIG), Sn, Ag, etc. or a standard photoresist material, which is well known from the manufacturing of printed circuit boards (PCBs).

FIG. 2 shows an electronic package 200, which is very similar to the electronic package 100 shown in FIG. 1F. The difference between the electronic package 200 and the electronic package 100 is that instead of using an adhesive material 120 for mounting the electronic component 130 onto the (patterned) metal foil 112a a bonding procedure is used. Thereby, bond connections 222 are formed in order to electrically connect the electronic component 130 with non-depicted external circuitry. By contrast to the electronic package 100 a formation of via connections 134 (shown in FIG. 1E) is not needed.

The bond connections can be created by bonding (the contacts of) the electronic component 130 onto the metal foil 112 for instance by means of thermo pressure bonding, ultrasonic bonding, or any other bonding procedure.

FIG. 3 shows an electronic package 300, wherein the formation of the encapsulant/embedding material structure 140 is supported by means of the barrier structure 345, which laterally delimits the (additively manufactured) encapsulant 140. The barrier structure 345 may be realized by an appropriate stencil and/or frame structure.

FIG. 4 shows an electronic package 400 with an electronic component 130 being encapsulated by means of two different encapsulants. A first encapsulant 440 is formed (directly) over the structured metal foil 112a. According to the embodiment described here, the first encapsulant 440 does not cover a top surface of the electronic component 130. A fully encapsulation of the electronic component 130 is completed by a further encapsulant 445.

It is pointed out that in reality at least one of the two encapsulants 400 and 440 consists or of comprises at least two layers. Hence, in reality the two encapsulants 400 and 440 are a layer construction comprising N layers. Each layer may have an individual optical, electrical, electromagnetic shielding, thermal and/or mechanical property which contribute to the overall property of the layered encapsulant structure. Specifically, different layers may have a different thermal spread and/or different electromagnetic shielding properties. The outermost layer may be optically transparent.

The depicted two encapsulants 440 and 445 may be made from different materials having in particular mechanical properties, which in combination ensure that the electronic component 130 is embedded in smooth and reliable manner. Thereby, depending on the thermal and/or mechanical properties of the electronic component 130 materials with appropriate coefficients of thermal expansion (CTE) and/or with an appropriate elasticity may be used for the two encapsulants 440 and 445.

FIG. 5 shows an electronic package 500 with an electronic component 130 being encapsulated by means of a dome-like first encapsulant 540 and a planarizing second encapsulant 545. By contrast to the electronic package 400 already the first encapsulant 540 fully encapsulated the electronic component 130. The further second encapsulant 545 is predominantly used for providing a planar upper surface of the electronic package 500.

Using the two encapsulants 540 and 545 an additional (mechanical and/or chemical) protection for the embedded electronic component 130 may be realized.

FIG. 6 shows an electronic package 600, which differs from the electronic package 500 shown in FIG. 5 in that the further second encapsulant 645 comprises embedded electrically conductive particles. These particles provide for an electromagnetic shielding of the electronic component 130 against external electromagnetic fields.

Further, the electronic package 600 differs from the electronic package 500 in that between (i) the patterned metal foil 112a on the one hand and (ii) the adhesive material 120, the first encapsulant 540, and the second encapsulant 645 on the other hand a non-conductive layer 614 is formed (as a cover for the patterned metal foil 112a). The combination of the patterned metal foil 112a and the non-conductive layer 614 can be realized in an effective manner for instance by means of Resin Coated Copper (RCC) foils or a laminate of (i) a copper cladded flexible material and (ii) polyimide, which are known from PCB manufacturing.

FIG. 7 shows an electronic package 700 in accordance with a further embodiment of the invention. The electronic package 700 comprises again the stack 110 having a patterned metal foil 112a and a protection layer 116 formed thereon. An electronic component 730 is mounted on the stack 110 by means of an adhesive material 120. An electric connection between the electronic component 730 and non-depicted external circuitry (via the patterned metal foil 112a) is realized by means of a via connection 134.

By contrast to the electronic package 100 shown in FIG. 1F the electronic component 730 comprises electric terminals 731 also on its lateral side surfaces. These electric terminals 731 are electrically connected with the wiring structure 760, which comprises several structured metallic layers 762 and the interconnects 764. Both the electric wiring structure 760 and the component 730 are completely encapsulated within an (additively a without external pressure formed) encapsulant 740.

Descriptively speaking, the electronic package 700 may be seen as a multilayer buildup with a combination of different materials on each layer. The electronic component 730 is completely embedded by the encapsulant 740. The contact terminals 731 on several side surfaces of the component 730 are electrically connected with the wiring structure 760. The electronic component 730 may be placed on a stack 110 representing a base material which may be made from or comprise a copper foil, a rolled copper foil (RCF), a flexible material, etc. A combination of plastics and metal layers can create an electrical and/or optical connectivity to the embedded electronic component 730 and to further external circuitry. The electronic component 730 may be a sensor component which is embedded and protected by relevant material to provide for a proper protection.

It should be noted that the term "comprising" does not exclude other elements or steps and the use of articles "a" or "an" does not exclude a plurality. Also, elements described in association with different embodiments may be combined.

LIST OF REFERENCE SIGNS 100 electronic package
110 stack
112 layer structure/metal foil
112a layer structure/metal foil (patterned)
116 further layer structure/protection layer structure
120 adhesive material
130 electronic component
134 via connections
140 encapsulant/embedding material
200 electronic package
222 bond connections
300 electronic package
345 barrier structure
400 electronic package
440 encapsulant
445 further encapsulant
500 electronic package
540 (dome like) encapsulant
545 further encapsulant
600 electronic package
614 coating layer
645 further encapsulant (with embedded particles)
700 electronic package
730 electronic component
731 electric terminals
740 encapsulant
760 wiring structure
762 (structured) metallic layer
764 via interconnect

The invention claimed is:

1. A method of manufacturing an electronic package, the method comprising:
dispensing an adhesive in a spatially-restricted manner to a region of a layer structure of a first stack of a component carrier which forms part of the electronic package;
thereafter placing an electronic component in the adhesive on the layer structure of the first stack;
encapsulating the electronic component by an encapsulant in a pressureless way; and
after encapsulating, forming at least one further layer structure at the layer structure of the first stack to thereby form a second stack beneath the encapsulated electronic component,
wherein the at least one further layer structure comprises a surface protection layer structure,
wherein the surface protection layer structure protects an electrically conductive structure of the first stack.

2. The method as set forth in claim 1, wherein encapsulating the electronic component is accomplished at a temperature being less than 200° C.

3. The method as set forth in claim 1, wherein encapsulating the electronic component comprises a deposition of encapsulation material by at least one of the following procedures:
(a) printing;
(b) coating;
(c) additive manufacturing;
(d) dispensing.

4. The method as set forth in claim 3, wherein the encapsulation material is not suitable to be applied under external pressure.

5. The method as set forth in claim 3, wherein the first stack represents a first portion of a component carrier, and the encapsulation material represents a second portion of the component carrier.

6. The method as set forth in claim 5, wherein the electronic package is a hybrid structure comprising the first stack as a printed circuit board structure and the encapsulation material as a non-printed circuit board structure.

7. The method as set forth in claim 1, wherein placing the electronic component comprises bonding the electronic component to the layer structure.

8. The method as set forth in claim 1, wherein the electronic component is encapsulated together with at least one further electronic component which, after a singularizing process, forms a part of a further electronic package.

9. The method as set forth in claim 1, wherein the layer structure comprises at least one electrically conductive layer structure and/or the at least one further layer structure comprises at least one electrically insulating layer structure.

10. The method as set forth in claim 1, further comprising:
a further encapsulant surrounding the encapsulation material, the further encapsulant being different from the encapsulation material, wherein the further encapsulant comprises an electrically conductive material.

11. The method as set forth in claim 10, wherein the encapsulation material encapsulating the electronic component and/or the further encapsulant surrounding the encapsulation material have a planar surface, wherein the planar surface is opposite to the stack.

12. The method as set forth in claim 10, wherein the electronic package comprises at least one of the following features:
the electronic package further comprises a wiring structure being embedded within the encapsulation material and/or within the further encapsulant, the wiring structure being configured for electrically connecting the electronic component;
the surface protection layer structure which is formed beneath the stack or forms a part of the stack.

13. The method as set forth in claim 1, wherein the surface protection layer structure substantially covers the whole bottom of the electrically conductive structure of the first stack.

14. The method as set forth in claim 1, wherein the surface protection layer structure is configured to prevent oxidation of the bottom surface of the electrically conductive structure of the first stack.

15. The method as set forth in claim 1, wherein the surface protection layer structure is electrically conductive.

* * * * *